United States Patent
Huebner

(10) Patent No.: US 7,074,072 B2
(45) Date of Patent: Jul. 11, 2006

(54) METHOD OF MAKING CONTACT WITH CIRCUIT UNITS TO BE TESTED IN A TESTER AND CONTACT-MAKING APPARATUS FOR IMPLEMENTING THE METHOD

(75) Inventor: Michael Huebner, Schönau (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/900,664

(22) Filed: Jul. 28, 2004

(65) Prior Publication Data
US 2005/0026477 A1 Feb. 3, 2005

(30) Foreign Application Priority Data
Jul. 29, 2003 (DE) ................. 103 34 548

(51) Int. Cl.
*H01R 11/18* (2006.01)
(52) U.S. Cl. ...................... 439/482; 324/754
(58) Field of Classification Search ................ 324/754, 324/765, 761; 439/482, 483, 484
See application file for complete search history.

(56) References Cited
U.S. PATENT DOCUMENTS
5,772,451 A * 6/1998 Dozier et al. .................. 439/70

6,791,345 B1 * 9/2004 Maruyama et al. ......... 324/754
2002/0048973 A1 4/2002 Zhou et al.
2003/0099097 A1 * 5/2003 Mok et al. ................... 361/767
2003/0173661 A1 9/2003 Zhou et al.

FOREIGN PATENT DOCUMENTS
DE 101 51 125 A1 6/2002

* cited by examiner

*Primary Examiner*—Chandrika Prasad
(74) *Attorney, Agent, or Firm*—Laurence A. Greenberg; Werner H. Stemer; Ralph E. Locher

(57) ABSTRACT

A contact-making apparatus for making contact with circuit units to be tested in a tester contains a printed circuit board device that has electrical connections to the tester, and a test module device. The test module device has first contact-making elements for making electrical contact between the test module device and the printed circuit board device, and second contact-making elements for making electrical contact between the test module device and the circuit unit to be tested. When the printed circuit board device and the circuit unit to be tested are pressed onto each other, a spring force of the first contact-making elements is lower than the spring force of the second contact-making elements under a low initial compression, and a spring force of the first contact-making elements are higher than the spring force of the second contact-making elements under a high final compression.

21 Claims, 4 Drawing Sheets

METHOD OF MAKING CONTACT WITH CIRCUIT UNITS TO BE TESTED IN A TESTER AND CONTACT-MAKING APPARATUS FOR IMPLEMENTING THE METHOD

BACKGROUND OF THE INVENTION

1. Field of the Invention

The present invention relates in general to a contact-making apparatus for making contact with circuit units which are to be tested in a tester and which can be present on a wafer. The invention relates in particular to a self-planarizing test module device and a corresponding contact-making method.

In order to test circuit units to be tested, it is necessary for contact to be made between the circuit units under test and the tester, in which test sequences, test procedures and/or test programs are provided. Here, making contact between the circuit unit to be tested and the tester represents a particularly critical problem, since any error when making contact with the circuit unit to be tested can lead to an increase in rejects. In order to make contact between circuit units to be tested and the tester, it is necessary to provide a printed circuit board device that has electrical connections to the tester.

A conventional contact-making apparatus for making contact with circuit units to be tested in a tester is illustrated in FIG. 4. A printed circuit board device 100 has electrical connections to the tester. A test module device 101 (also designated a probe head) has a contact-making device 204, with which an electrical connection is produced between the test module device 101 and the printed circuit board device 100. In FIG. 4, contact-making elements of the cantilever type are illustrated on the underside of the test module device 101. The contact-making elements are used to make contact between the test module device 101 and the circuit unit to be tested. The circuit unit to be tested can be, for example, a chip disposed on a wafer. Contact with the circuit unit to be tested is thus made by pressing the circuit unit (or the wafer) to be tested against the contact-making elements fitted to the underside of the test module device 101. Compressing the printed circuit board device 100 onto the circuit unit to be tested thus produces contact. An electrical connection between the test module device 101 and the printed circuit board device 100 is provided by the contact-making device 204 (also designated an "interposer").

In order to make reliable contact between the test module device 101 and the circuit unit to be tested, it is important that the surface of the test module device 101 which faces the circuit unit to be tested is substantially parallel to the wafer surface on which the circuit unit to be tested is disposed. In order to set the test module device 101, the conventional contact-making apparatus has at least one adjusting device 201. The contact-making apparatus according to the prior art preferably has at least three adjusting devices 201. In the example illustrated in FIG. 4, an adjusting device 201 has adjusting pins 202 and adjusting nuts 203. However, adjusting the test module device 101 with respect to the printed circuit board device 100 is disadvantageously extremely time-consuming and costly.

In addition, the test module device 101 is deformed in an inexpedient manner as a result of setting the adjusting nuts 203 on the adjusting pins 202. Setting plane parallelism between the test module device 101 and the wafer with the circuit units to be tested is thus extremely difficult. Inexpediently, it is necessary for the conventional contact-making apparatus to be monitored and corrected continuously with respect to planarity and/or tilting of the test module device 101 with respect to the wafer surface. The measuring devices for monitoring planarity and/or tilting of the test module device 101 with respect to the wafer surface, that is to say what are known as test module analyzers, are extremely complicated and costly. Furthermore, it is disadvantageous that a check of this type is very time-consuming.

In particular, adjusting the test module device 101 using the adjusting pins 202 and corresponding adjusting nuts 203 is very cumbersome and requires special knowledge, so that an adjustment of this type for carrying out mass-production tests of circuit units to be tested can be carried out only with difficulty or even not at all.

SUMMARY OF THE INVENTION

It is accordingly an object of the invention to provide a method of making contact with circuit units to be tested and a self-planarizing test module device for implementing the method which overcome the above-mentioned disadvantages of the prior art devices and methods of this general type, in which alignment of a test module device when a printed circuit board apparatus and a circuit unit to be tested are pressed on each other is provided in a simple way without any requirement for adjusting devices to be set separately.

With the foregoing and other objects in view there is provided, in accordance with the invention, a contact-making apparatus for making contact with circuit units to be tested in a tester. The apparatus contains a printed circuit board device having electrical connections to the tester and a test module device having first contact-making elements for making electrical contact between the test module device and the printed circuit board device and second contact-making elements disposed on a side of the test module device facing away from the first contact-making elements, for making electrical contact between the test module device and a circuit unit to be tested. The first and second contact-making elements have first and second spring constants, respectively, and when the printed circuit board device and the circuit unit to be tested are pressed onto each other, starting from an uncompressed state, the first and second contact-making elements are compressed via a low initial compression and finally are compressed as far as a high final compression. The first contact-making elements have a spring force that is lower than a spring force of the second contact-making elements under the low initial compression. The spring force of the first contact-making elements is higher than the spring force of the second contact-making elements under the high final compression.

An important idea of the invention is, on opposite sides of the test module device which serves as a connecting device between the printed circuit board device, which has electrical connections to the tester, and the circuit unit to be tested, to provide contact-making elements which have different spring constants. The contact-making elements include first contact-making elements for making electrical contact between the test module device and the printed circuit board device, and second contact-making elements. The second contact-making elements are disposed on a side of the test module device facing away from the first contact-making elements, for making electrical contact between the test module device and the circuit unit to be tested. A spring force of the first contact-making elements is lower than the spring force of the second contact-making elements under a low initial compression, and a spring force of the first contact-making elements is higher than the spring force of the second contact-making elements under a high final compression.

It is thus an advantage of the present invention that the connection of circuit units to be tested to a tester is simplified substantially, since any adjusting apparatuses are eliminated.

A further advantage of the present invention is that a test module device can be constructed substantially more simply than in accordance with the prior art.

Expediently, planarization of a test module device takes place in a self-adjusting manner when the wafer is applied to the test module device and a printed circuit board device and the wafer with the circuit units to be tested are pressed on each another.

It is thus expedient that testing of circuit units to be tested with a tester, contact being made with the circuit units to be tested by a test module device, is simplified and is therefore suitable for mass-production testing of circuit units to be tested.

Furthermore, costs are advantageously saved when testing circuit units to be tested.

Furthermore, the method according to the invention for making contact with circuit units to be tested in a tester substantially includes providing a printed circuit board device; connecting the printed circuit board device to the tester in order to exchange test signals with the tester; producing a test module device as a connecting element between the printed circuit board device and the circuit unit to be tested; making contact between the test module device and the printed circuit board device by the first contact-making elements; and making contact between the test module device and the circuit unit to be tested by second contact-making elements. The second contact-making elements are disposed on a side of the test module device facing away from the first contact-making elements. In the method, furthermore, the printed circuit board device and the circuit unit to be tested are pressed onto each other. The first and second contact-making elements have first and second spring constants in such a way that, when the printed circuit board device and the circuit unit to be tested are pressed onto each other, starting from an uncompressed state, the first and second contact-making elements are compressed via a low initial compression as far as a high final compression. The spring force produced by the first contact-making elements is lower than the spring force of the second contact-making elements under the low initial compression, and the spring force produced by the first contact-making elements is higher than the spring force of the second contact-making elements under the high final compression.

According to a preferred development of the present invention, the first and/or second contact-making elements are formed as contact-making bumps. Contact-making bumps of this type can advantageously be produced from a conductive elastomer or polymer material, that is to say what are known as elastomer bumps are formed.

Contact-making bumps of this type have a spring characteristic that produces a nonlinear relationship between a spring force and a spring compression. First, high compression takes place in the contact-making bumps under a low spring force, while the compression becomes lower during a further increase in the spring force, that is to say the result is a variation of the spring force over the compression which is similar to an exponential function.

According to yet another preferred development of the present invention, the first and/or the second contact-making elements are formed as cantilever spring elements. Cantilever spring elements have the particular advantage that their spring characteristic, defined as a spring force as a function of the spring compression, exhibits a substantially linear variation.

According to yet another preferred development of the present invention, the first and/or the second contact-making elements are formed as buckling wire spring elements. The buckling wire spring elements have the advantage, which is important for the development of the invention, that their spring constant provides a nonlinear variation in such a way that a low initial compression is produced by a high initial spring force, while a final compression is produced under a spring force which has to be increased only slightly beyond that.

According to yet another preferred development of the present invention, the first and/or the second contact-making elements are formed as spiral springs.

According to yet another preferred development of the present invention, the test module device is formed as a thin, resilient printed circuit board. By configuring the test module device from a material which is flexible to some extent, in addition to planarization achieved by the contact-making method according to the invention, in addition compensation for possible irregularities on the wafer on which the circuit units to be tested are disposed or on the test module device itself is achieved.

According to yet another preferred development of the present invention, the first and/or the second contact-making elements are disposed in a matrix structure. In this case, the matrix structure of the second contact-making elements for making contact between the test module device and the circuit unit to be tested is matched to the circuit unit to be tested.

According to yet another preferred development of the present invention, the printed circuit board device has at least one guide device for the lateral guidance of the test module device. Advantageously, the printed circuit board device also has at least one holding device for holding the test module device. Advantageously, it is in this way possible to dispense with any adjusting devices such as adjusting pins, adjusting nuts, setting screws etc.

The matrix structure of the first contact-making elements is predefined by the requirements to make contact between the test module device and the printed circuit board device. Advantageously, the first contact-making elements are connected electrically to the second content-making elements on the test module device via a predefinable connecting structure. The first contact-making elements and the second contact-making elements are disposed on opposite sides of the test module device.

According to yet another preferred development of the present invention, the second contact-making elements have contact-making surfaces which taper to a point or contact-making points, in such a way that an oxide layer present on the circuit unit to be tested is penetrated or is scratched off by slight lateral movement of the test module device with respect to the circuit unit to be tested.

According to yet another preferred development of the present invention, a point of intersection of a spring characteristic curve of the first contact-making elements with a spring force characteristic curve of the second contact-making elements is predefined in a variable manner in a graph of spring force against compression. Defining this point of intersection has the advantage that a spring force of the first contact-making elements is predefinably lower than the spring force of the second contact-making elements under a low initial compression, and that, furthermore, a spring force of the first contact-making elements is predefinably higher than the spring force of the second contact-making elements under a high final compression.

Other features which are considered as characteristic for the invention are set forth in the appended claims.

Although the invention is illustrated and described herein as embodied in a method of making contact with circuit units to be tested and a self-planarizing test module device for implementing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
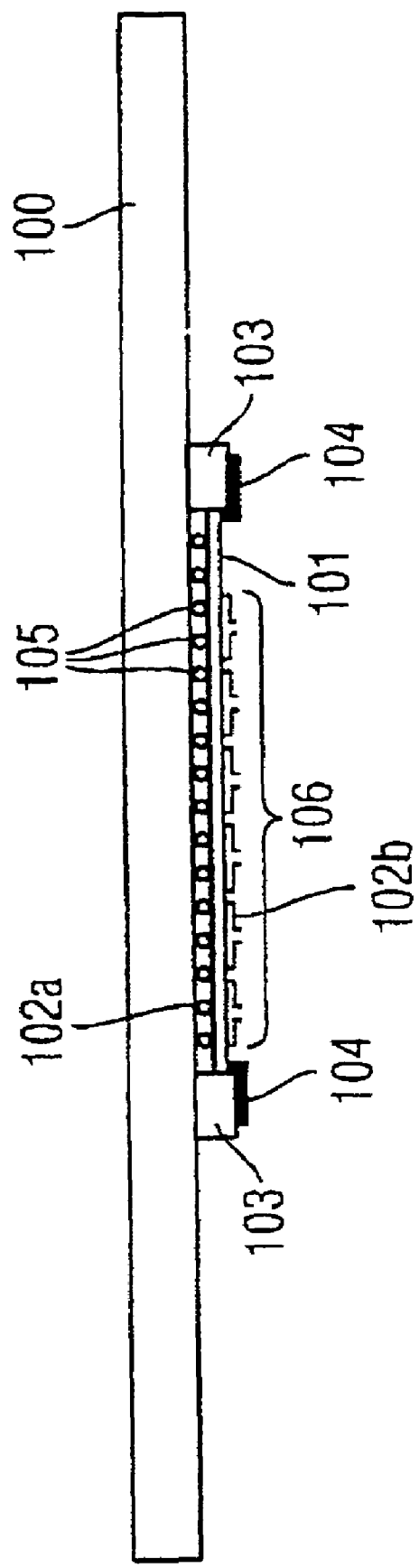
FIG. 1 is a diagrammatic, side view of a contact-making apparatus containing a test module device which has first and second contact-making elements, according to a first exemplary embodiment of the invention.

Referring now to the figures of the drawing in detail and first, particularly, to FIG. 1 thereof, there is shown a contact-making apparatus. In the contact-making apparatus, a printed circuit board device 100 has guide devices 103 for the lateral guidance of a test module device 101. The test module device 101 is provided with first contact-making elements 105 on the upper side, shown in FIG. 1, while the test module device 101 is provided with second contact-making elements 106 on an opposite side (lower side in FIG. 1).

The printed circuit board device 100 is connected by non-illustrated electrical connections to a tester, which generates test signals and analyzes signals sent back by a non-illustrated circuit unit to be tested. In the exemplary embodiment of the present invention shown in FIG. 1, the first contact-making elements 105 are formed as contact-making bumps 102a. The first contact-making elements 105, formed as contact-making bumps 102a, preferably are formed of a conductive elastomer or polymer material, or of a nonconductive resilient material (for example silicone) in which thin metal conductors are embedded or led to the surface of the bump. In this way, the spring characteristic of the resilient bump can be combined with the good electrical properties of metallic conductors.

The second contact-making elements 106 in the preferred exemplary embodiment of the present invention shown in FIG. 1 are formed as cantilever spring elements 102b. In an unloaded state, the test module device 101 is held on the guide devices 103 by holding devices 104.

Thus, the test module device 101 is secured against falling out in the uncompressed or unloaded state. The test module device 101 has a predefined connecting structure between the first and second contact-making elements 105 and 106 disposed on its opposite surfaces. The test module device 101 therefore serves to transmit electrical signals from the printed circuit board device 100 to the circuit unit to be tested and vice versa. The second contact-making elements 106, which are configured as cantilever spring elements 102b in the exemplary embodiment shown in FIG. 1, make contact with the circuit unit to be tested or the chip to be tested, which can be disposed on a wafer during the test.

In order to implement the method according to the invention of making contact between circuit units to be tested and a tester, it is necessary for the spring characteristics of the first and second contact-making elements 105 and 106 to be chosen such that the spring force of the first contact-making elements is considerably-lower than the spring force of the second contact-making elements under low compression. By setting the appropriate spring forces, it is ensured, under low compression, that the test module device 101 can initially be set parallel to the wafer surface on which the circuit units (chips) to be tested are disposed.

With increasing compression, in particular under the final compression, the spring force of the first contact-making elements 105 is intended to rise more steeply or to be higher than the spring force of the second contact-making elements, in order that the second contact-making elements are then likewise compressed. In this case, the further advantage results that, by slight lateral movements of the second contact-making elements with respect to the contact-making surfaces of the circuit unit to be tested, penetration of oxide layers on the contact surfaces of the circuit unit to be tested, which is disposed on the wafer, is provided.

It is advantageously possible to provide suitably configured second contact-making elements 106 in which compression leads to a horizontal movement or to a lateral movement of a contact-making point of the second contact-making elements 106.

This makes it possible for any oxide layer that may be present on the contact surfaces of the circuit unit to be tested to be scratched or penetrated. According to the invention, the first and/or second contact-making elements 105 and 106 are now formed from different materials, such as, for example, contact-making bumps of conductive elastomers, cantilever springs or spring elements and vertical buckling wire spring elements (also designated "buckling beams"). The corresponding variations in spring force against spring compression, that is to say the corresponding spring characteristics, will be explained below with reference to FIG. 3.

Figure 2:
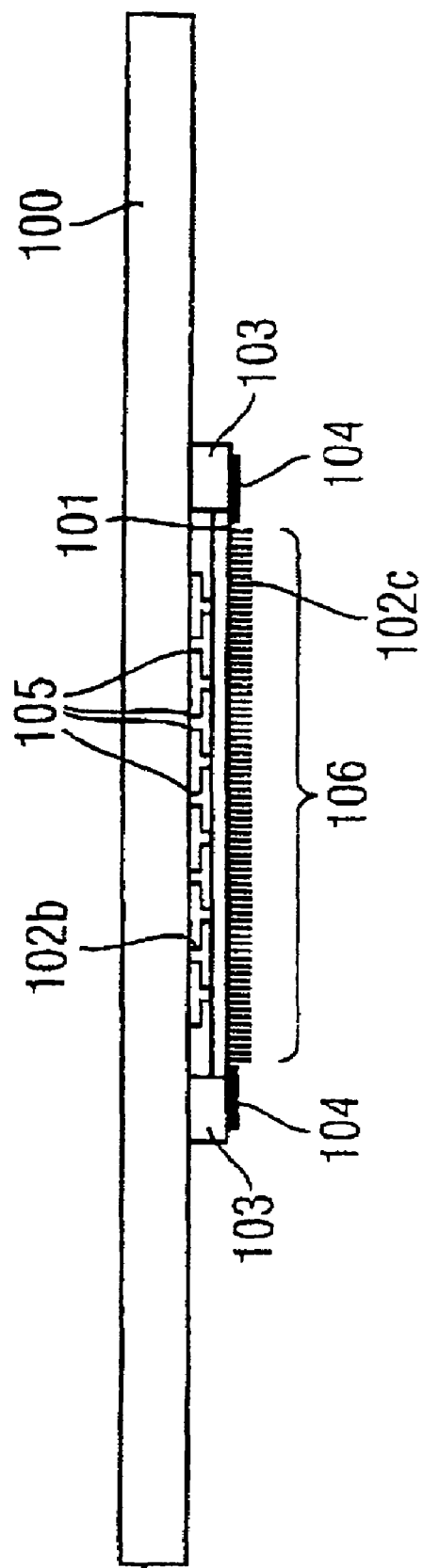
FIG. 2 is a diagrammatic, side view of the contact-making apparatus according to a second exemplary embodiment of the invention.

FIG. 2 shows a further exemplary embodiment according to the present invention. Identical or functionally identical components or steps that have been described above with reference to FIG. 1 are left out here in order to avoid an overlapping description.

As shown in FIG. 2, the first contact-making elements 105 are formed here as cantilever spring elements 102b, while the second contact-making elements 106 are formed as buckling wire spring elements 102c. By such a choice of the first and second contact-making elements 105, 106, it is again ensured that the spring characteristic of the first contact-making elements 105 and of the second contact-making elements 106 is configured such that the spring force of the first contact-making elements 105 is considerably lower than the spring force of the second contact-making elements 106 under a low initial compression.

This has the same effects as described with reference to FIG. 1, namely those that, under low compression, the test module device 101 is set parallel to a wafer surface on which the circuit units to be tested are disposed. During the increasing compression, the spring force of the first contact-making elements 105 or the cantilever spring elements 102b will then rise more steeply than the spring force of the second contact-making elements 106 or the buckling wire spring elements 102c.

Thus, finally, with increasing compression, the buckling wire spring elements 102c are also increasingly compressed and make contact reliably with the contact surfaces of the circuit unit to be tested or of the chip to be tested on the wafer surface.

The first and/or the second contact-making elements are preferably disposed in a matrix structure. In this case, the second contact-making elements 106 typically produce 4000 connections to the circuit unit to be tested. The typical spacing of the individual contact-making elements 106 disposed in the matrix is, for example, 0.4 mm, so that exact positioning is required. Thus, the method according to the invention for making contact with circuit units to be tested and the contact-making apparatus for implementing the method can advantageously be used on contact-making elements with such a high contact-making density.

Figure 3:
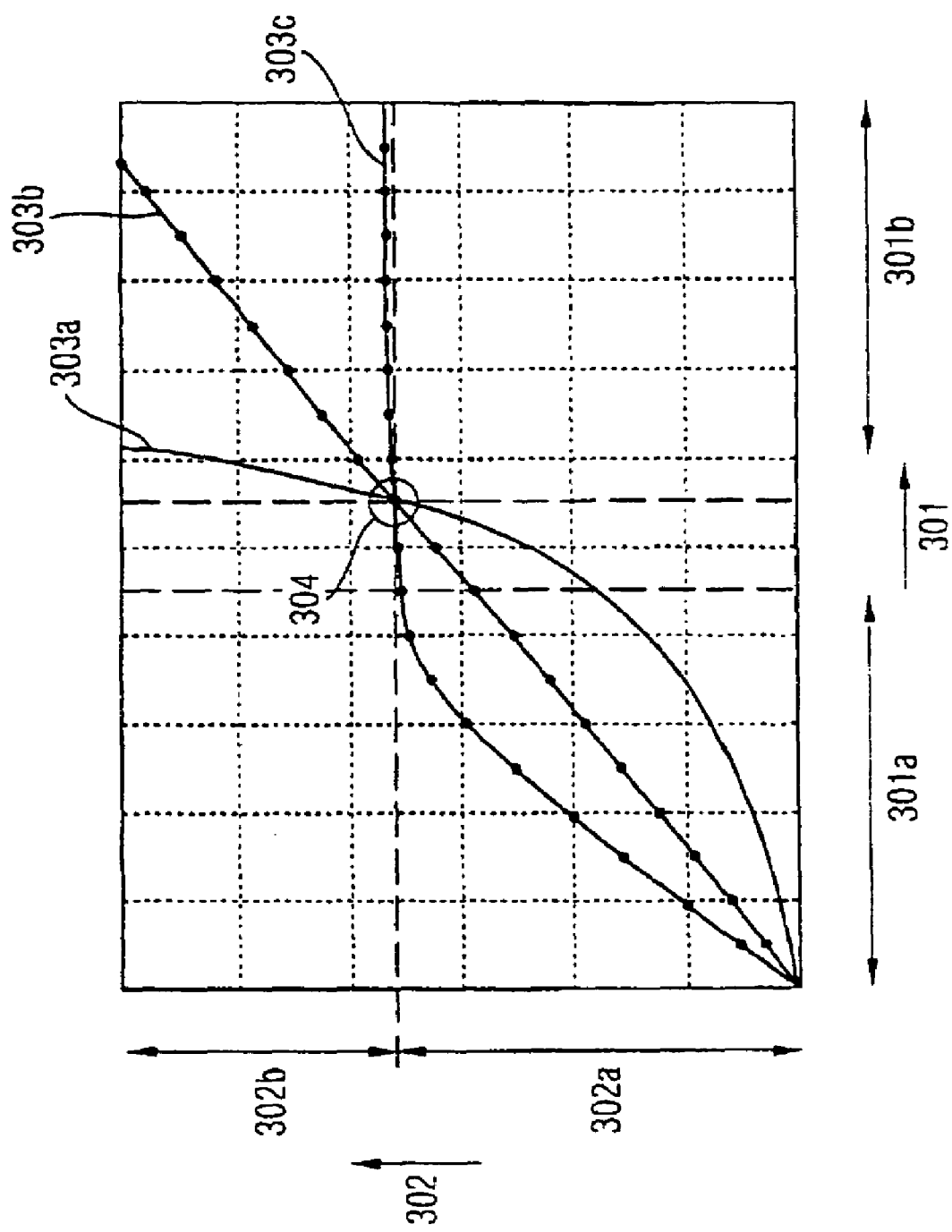
FIG. 3 is a graph in which a spring force is illustrated against compression for different spring characteristics of various contact-making elements such as contact-making bumps, cantilever spring elements and buckling wire spring elements.

FIG. 3 shows a graph in which a spring force 302 is illustrated as a function of compression 301 of the first and/or second contact-making elements 105 and 106. A spring characteristic curve of different first and/or second contact-making elements 105, 106, which are produced as contact-making bumps 102a, cantilever spring elements 102b and/or buckling wire spring elements 102c, is illustrated in summary in FIG. 3 in a graph of spring force against compression.

The continuous, bold curve 303a shows a spring characteristic of contact-making bumps 102a. The spring characteristic 303a of the contact-making bumps 102a is characterized in that a spring force 302a is low under an initial compression 301a, while a high spring force 302b has to be applied for a final compression 301b.

The approximately exponential variation of the spring force against the compression of the contact-making bumps 102a makes it possible for a spring force 302a of the first contact-making elements 105 to be lower than the spring force 302a of the second contact-making elements 106 under a low initial compression 301a, and for a spring force 302b of the first contact-making elements 105 to be higher than the spring force 302b of the second contact-making elements 106 under a high final compression 301b.

The continuous curve 303b identified by diamonds in FIG. 3 designates the spring characteristic of cantilever spring elements. Cantilever spring elements produce a substantially linear spring characteristic, that is to say a linear relationship between the spring force 302 and the compression 301.

As illustrated in FIG. 3, the curves of the spring characteristic 303a of contact-making bumps 102a and the spring characteristic 303b of cantilever spring elements 102b intersect at a point of intersection 304. Therefore, a spring force 302a for the contact-making bumps 102a under an initial compression 301a is lower than a spring force 302a for the cantilever spring elements under an initial compression 301a.

If the compression is increased as far as a final compression 301b, then the relationships reverse exactly, that is to say a spring force of the contact-making bumps 102a exceeds the spring force of the cantilever spring elements 102b.

The method according to the invention now assumes that, as explained in detail above with reference to FIG. 1, the first contact-making elements 105 are produced as contact-making bumps 102a, while the second contact-making elements 106 are produced as cantilever spring elements 102b. This ensures that the first and second contact-making elements 105 and 106 have first and second spring constants such that, when the printed circuit board device 100 and the circuit unit to be tested are pressed together, or the circuit unit to be tested is pressed against the test module device 101, starting from an uncompressed state, the first and second contact-making elements 105 and 106 are compressed via a low initial compression 301a to a high final compression 301b, the spring force 302a of the first contact-making elements 105 being lower than the spring force 302a of the second contact-making elements 106 under the low initial compression 301a, and the spring force 302b of the first contact-making elements 105 being higher than the spring force 302b of the second contact-making elements 106 under a high final compression 301b.

Furthermore, FIG. 3 illustrates a spring characteristic 303c of buckling wire spring elements 102c by the continuous curve identified by squares. Under a low initial compression 301a, the buckling wire spring elements 102c produce a high spring force 302a, while a final compression 301b requires a low spring force 302b. Thus, the spring force relationships with respect to the initial compression and the final compression likewise reverse after passing through the point of intersection 304.

It should be pointed out that the spring characteristics of the contact-making bumps 102a, the cantilever spring elements 102b and the buckling wire spring elements 102c can have a profile in the exemplary embodiment illustrated, such that the curves of the appropriate spring characteristics intersect at a single point of intersection 304.

However, it is possible and will clearly be recognized by the average person skilled in the art that there are also different points of intersection between the individual curves of the spring characteristics of contact-making elements.

In order to implement the method according to the invention for making contact with the circuit units to be tested by a test module device 101 disposed between the printed circuit board device 100 and the circuit unit to be tested, it is merely necessary for the curves of the spring characteristics of the first and second contact-making elements 105 and 106 in general to have a point of intersection, so that, as explained in detail above the intensity of the spring forces under initial and final compression reverse.

Figure 4:
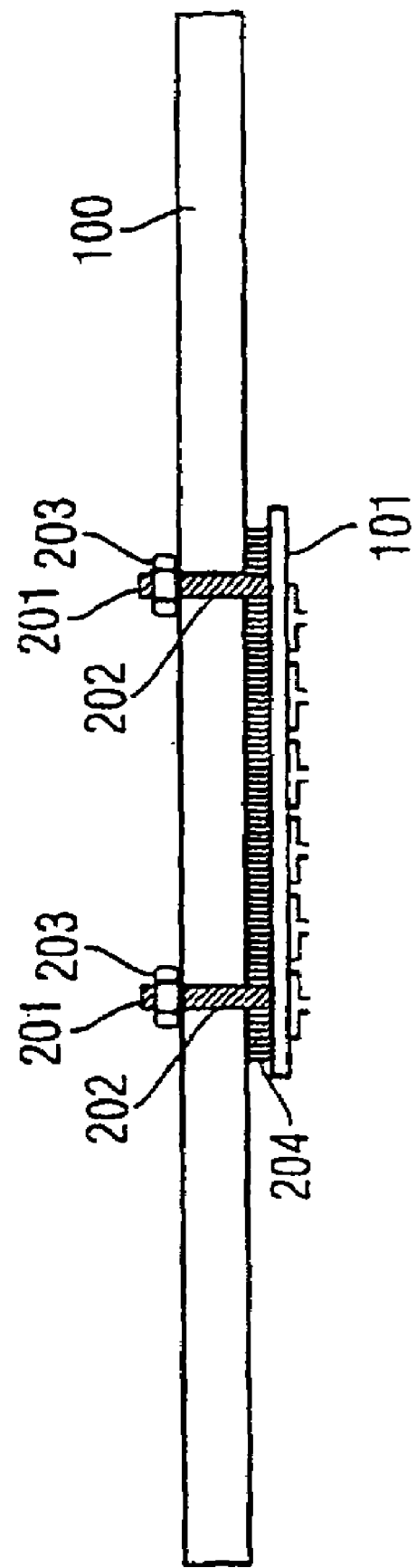
FIG. 4 is a diagrammatic, side view of a conventional contact-making apparatus with adjusting devices.

With respect to the conventional contact-making apparatus illustrated in FIG. 4 for making contact with circuit units to be tested in a tester, reference is made to the introduction to the description.

Although the present invention has been described above by using preferred exemplary embodiments, it is not restricted to these but can be modified in many ways.

The invention is not restricted to the possible applications cited either.

This application claims the priority, under 35 U.S.C. § 119, of German patent application No. 103 34 548.5, filed Jul. 29, 2003; the entire disclosure of the prior application is herewith incorporated by reference.

I claim:

1. A contact-making apparatus for making contact with circuit units to be tested in a tester, comprising:
   a printed circuit board device having electrical connections to the tester;
   a test module device having first contact-making elements for making electrical contact between said test module device and said printed circuit board device and second contact-making elements disposed on a side of said test module device facing away from said first contact-making elements, for making electrical contact between maid test module device and a circuit unit to be tested;

said first contact-making elements having a first non-linear spring force against compression characteristics and said second contact-making elements having a second non-linear spring force against compression characteristics, and curves representing said first and second non-linear spring force against compression characteristics intersecting at a point of intersection, so that when said printed circuit board device and the circuit unit to be tested are pressed onto each other, starting from an uncompressed state, said first and second contact-making elements being compressed via a low initial compression and finally being compressed as far as a high final compression;

said first contact-making elements having a spring force being lower than a spring force of said second contact-making elements under the low initial compression; and said spring force of said first contact-making elements being higher than said spring force of said second contact-making elements under the high final compression.

2. The apparatus according to claim 1, wherein at least one of said first and second contact-making elements are formed as contact-making bumps.

3. The apparatus according to claim 2, wherein said first and second contact-making elements formed as said contact-making bumps are produced from a material selected from the group consisting of conductive elastomer, polymer materials, and nonconductive resilient materials and have thin metal conductors one of embedded and led on a surface of said contact making bumps.

4. The apparatus according to claim 1, wherein at least one of said first and second contact-making elements are formed as cantilever spring elements.

5. The apparatus according to claim 1, wherein at least one of said first and second contact-making elements are formed as buckling wire spring elements.

6. The apparatus according to claim 1, wherein said test module device is formed as a thin, resilient printed circuit board.

7. The apparatus according to claim 1, wherein at least one of said first and second contact-making elements are formed and disposed in a matrix structure.

8. The apparatus according to claim 1, wherein said printed circuit board device has at least one guide device for laterally guiding said test module device.

9. The apparatus according to claim 1, wherein said printed circuit board device has at least one holding device for holding said test module device.

10. The apparatus according to claim 1, wherein said first contact-making elements are connected electrically to said second contact-making elements on said test module device via a predefinable connecting structure.

11. The apparatus according to claim 1, wherein at least one of said first and second contact-making elements, are formed as cantilever spring elements each having a non-linear spring characteristic.

12. The apparatus according to claim 3, wherein said first and second contact-making elements are formed from silicon.

13. The apparatus according to claim 4, wherein said first and second contact-making elements formed as said cantilever spring elements produce a non-linear spring characteristic.

14. A method for making contact with circuit units to be tested in a tester, which comprises the steps of:

providing a printed circuit board device;
connecting the printed circuit board device to the tester;
providing a test module device;
making contact between the test module device and the printed circuit board device using first contact-making elements; and
making contact between the test module device and the circuit unit to be tested using second contact-making elements, the second contact-making elements being disposed on a side of the test module device facing away from the first contact-making elements, the making contact step being performed by the step of:
pressing the printed circuit board device and the circuit unit to be tested onto each other, the first contact-making elements having a first non-linear spring force against compression characteristics and the second contact-making elements having a second non-linear spring force against compression characteristics, and curves representing the first and second non-linear spring force against compression characteristics intersecting at a point of intersection such that, when the printed circuit board device and the circuit unit to be tested are pressed onto each other, starting from an uncompressed state, the first and second contact-making elements are compressed via a low initial compression and finally being compressed as far as a high final compression, under the low initial compression a spring force produced by the first contact-making elements being lower than the spring force of the second contact-making elements, and under the high final compression the spring force produced by the first contact-making elements being higher than the spring force of the second contact-making elements.

15. The method according to claim 14, which further comprises forming at least one of the first and the second contact-making elements as contact-making bumps.

16. The method according to claim 14, which further comprises disposing at least one of the first and the second contact-making elements in a matrix structure.

17. The method according to claim 14, which further comprises guiding laterally the test module device using at least one guide device fitted to the printed circuit board device.

18. The method according to claim 14, which further comprises in an unloaded state, holding the test module device by at least one holding device fitted to the printed circuit board device.

19. The method according to claim 14, which further comprises electrically connecting the first contact-making elements to the second contact-making elements on the test module device via a predefinable connecting structure.

20. The method according to claim 14, which further comprises predefining a point of intersection of a spring characteristic curve of the first contact-making elements with a spring characteristic curve of the second contact-making elements in a variable manner in a graph plotting spring force against compression.

21. The method according to claim 14, which further comprises forming the second contact-making elements to have contact-making surfaces which taper to a point such that during a lateral movement of the second contact-making elements an oxide layer present on the circuit unit to be tested is penetrated.

* * * * *